(12) United States Patent
Kim et al.

(10) Patent No.: US 9,093,536 B2
(45) Date of Patent: Jul. 28, 2015

(54) THIN FILM TRANSISTOR SUBSTRATE AND METHOD OF MANUFACTURING THE SAME

(71) Applicant: Samsung Display Co., LTD., Yongin, Gyeonggi-Do (KR)

(72) Inventors: Gun-Hee Kim, Hwaseong-si (KR); Sei-Yong Park, Suwon-si (KR); Woo-Ho Jeong, Yongin-si (KR); Jin-Hyun Park, Yongin-si (KR); Jee-Hun Lim, Seongnam-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 13/914,821

(22) Filed: Jun. 11, 2013

(65) Prior Publication Data

US 2014/0225195 A1    Aug. 14, 2014

(30) Foreign Application Priority Data

Feb. 12, 2013   (KR) .................. 10-2013-0014780

(51) Int. Cl.
*H01L 29/10* (2006.01)
*H01L 29/786* (2006.01)
(Continued)

(52) U.S. Cl.
CPC ........ *H01L 29/786* (2013.01); *H01L 29/42384* (2013.01); *H01L 29/66742* (2013.01); *H01L 29/66969* (2013.01); *H01L 29/7869* (2013.01); *H01L 29/78606* (2013.01); *H01L 29/78648* (2013.01); *H01L 29/78696* (2013.01)

(58) Field of Classification Search
CPC ............ H01L 27/1225; H01L 29/7869; H01L 29/78693; H01L 29/786; H01L 29/66742; H01L 27/3248; H01L 27/3251; H01L 27/3253; H01L 27/3262; H01L 27/3272
USPC ............................ 257/43, E29.296; 438/104
See application file for complete search history.

(56) References Cited

U.S. PATENT DOCUMENTS 3,450,966 A * 6/1969 Silver et al. .................... 257/43
5,587,330 A * 12/1996 Yamazaki ..................... 438/162
8,232,551 B2 * 7/2012 Kim et al. ........................ 257/43

(Continued)

FOREIGN PATENT DOCUMENTS

KR    1020110071641 A    6/2011

OTHER PUBLICATIONS

"cover." Merriam-Webster.com. 2015. http://www.merriam-webster.com/dictionary/cover (retrieved Mar. 16, 2015).*

*Primary Examiner* — Eva Y Montalvo
*Assistant Examiner* — Samuel Lair
(74) *Attorney, Agent, or Firm* — Cantor Colburn LLP

(57) ABSTRACT

A thin film transistor substrate includes a substrate, a gate electrode disposed on the substrate, a gate insulation layer disposed on the gate electrode, an oxide semiconductor pattern disposed on the gate insulation layer, where the oxide semiconductor pattern includes a first area whose carrier concentration is in a range of about $10^{17}$ per cubic centimeter to about $10^{19}$ per cubic centimeter and a second area whose carrier concentration is less than the carrier concentration of the first area, an etch stopper disposed on the oxide semiconductor pattern, where the etch stopper covers the first area and the second area of the oxide semiconductor pattern, a signal electrode partially overlapping the etch stopper and the second area, and a passivation layer which covers the etch stopper and the signal electrode.

8 Claims, 11 Drawing Sheets

(51) Int. Cl.
*H01L 29/66* (2006.01)
*H01L 29/423* (2006.01)

(56) References Cited

U.S. PATENT DOCUMENTS

| | | |
|---|---|---|
| 8,258,511 B2 | 9/2012 | Ye |
| 8,330,155 B2* | 12/2012 | Jeon et al. ........................ 257/43 |
| 2008/0299702 A1* | 12/2008 | Son et al. ....................... 438/104 |
| 2009/0155940 A1* | 6/2009 | Lee et al. ........................ 438/29 |
| 2010/0025676 A1* | 2/2010 | Yamazaki et al. ............... 257/43 |
| 2010/0051937 A1* | 3/2010 | Kaji et al. ........................ 257/43 |
| 2012/0025187 A1* | 2/2012 | Park et al. ........................ 257/43 |
| 2012/0126223 A1* | 5/2012 | Maeng et al. .................... 257/43 |
| 2012/0161124 A1* | 6/2012 | Yamazaki ........................ 257/43 |
| 2012/0223304 A1* | 9/2012 | Yoneda ........................... 257/43 |
| 2012/0235137 A1 | 9/2012 | Koezuka et al. |
| 2012/0262983 A1* | 10/2012 | Kobayashi .................... 365/154 |
| 2012/0313092 A1* | 12/2012 | Shieh et al. ..................... 257/43 |
| 2013/0009145 A1* | 1/2013 | Jeon et al. ....................... 257/43 |

* cited by examiner

THIN FILM TRANSISTOR SUBSTRATE AND METHOD OF MANUFACTURING THE SAME

This application claims priority to Korean Patent Application No. 10-2013-0014780, filed on Feb. 12, 2013, and all the benefits accruing therefrom under 35 U.S.C. §119, the content of which in its entirety is herein incorporated by reference.

BACKGROUND

1. Field

Exemplary embodiments of the invention relate to a thin film transistor substrate and a method of manufacturing the thin film transistor substrate. More particularly, exemplary embodiments of the invention relate to a thin film transistor substrate for a display device and a method of manufacturing the thin film transistor substrate.

2. Description of the Related Art

Recently, display technologies have been developed for a display device including an oxide semiconductor gate ("OSG") as a driving gate electrode for an organic light emitting diode ("OLED"). The OLED is used as a light emitting element of the display device. The display device including OLED typically has a wide viewing angle, high response speed and low power consumption.

When the display device includes both the OLED and the OSG, a high current level between a source electrode and a drain electrode of a thin film transistor is typically used under a certain gate voltage, e.g., 10 Volts. Hereinafter, the current level under the certain gate voltage is referred to as saturation mobility.

However, conventional thin film transistors have low saturation mobility less than a desired level in a channel area. Accordingly, attempts have been made to form a passivation layer covering the thin film transistor under high hydrogen (hereinafter, "high-H2") condition to increase saturation mobility of the thin film transistor.

SUMMARY

One or more exemplary embodiment of the invention provides a thin film transistor substrate including a switching-adjustable thin film transistor having high saturation mobility.

Another exemplary embodiment of the invention provides a method of manufacturing the thin film transistor substrate.

In an exemplary embodiment of a thin film transistor according to the invention, the thin film transistor includes a substrate, a gate electrode disposed on the substrate, a gate insulation layer disposed on the gate electrode, an oxide semiconductor pattern disposed on the gate insulation layer, an etch stopper disposed on the oxide semiconductor pattern, where the etch stopper covers a first area and a second area of the oxide semiconductor pattern, a signal electrode which overlaps a portion of the etch stopper and the second area, and a passivation layer which covers the etch stopper and the signal electrode. The oxide semiconductor pattern has the first area whose carrier concentration is in a range of about $10^{17}$ per cubic centimeter ($cm^{-3}$) to about $10^{19}$ per cubic centimeter ($cm^{-3}$), and the second area whose carrier concentration less than the carrier concentration of the first area.

In an exemplary embodiment, the signal electrode may include titanium or titanium oxide.

In an exemplary embodiment, the second area may have carrier concentration in a range of about zero $cm^{-3}$ to about $10^{16}$ $cm^{-3}$.

In an exemplary embodiment, the signal electrode may include a source electrode which overlaps a first end portion of the second area, and a drain electrode spaced apart from the source electrode. The source electrode may be electrically connected to a data line. The drain electrode may overlap a second end portion of the second area.

In an exemplary embodiment, the thin film transistor substrate may further include a pixel electrode electrically connected to the drain electrode through a contact hole defined in the passivation layer.

In an exemplary embodiment, the passivation layer may include silicon nitride.

In an exemplary embodiment, an area ratio of the first area with respect to the second area may be in a range of about 2 to about 8.

In an exemplary embodiment, a width of the oxide semiconductor pattern may be in a range of about 10 micrometers (μm) to about 100 micrometers (μm).

In an exemplary embodiment of a method of manufacturing a thin film transistor according to the invention, the method includes providing a gate metal layer on a substrate, providing a gate electrode by patterning the gate metal layer, providing a gate insulation layer which covers the gate electrode, providing an oxide semiconductor pattern on the gate insulation layer, providing an etch stopper which overlaps a portion of the oxide semiconductor pattern, providing a signal electrode which overlaps both end portions of the etch stopper and exposes a portion of the etch stopper between the both end portions, and providing a passivation layer on the etch stopper and the signal electrode such that a first area of the oxide semiconductor pattern corresponding to an exposed portion of the etch stopper has a carrier concentration in a range of about $10^{17}$ $cm^{-3}$ to about $10^{19}$ $cm^{-3}$.

In an exemplary embodiment, the passivation layer may include silicon nitride.

In an exemplary embodiment, the providing the passivation layer may include depositing the passivation layer on the substrate using a mixed gas of silicon hydride and ammonia.

In an exemplary embodiment, a mixing ratio of ammonia with respect to silicon hydride of the mixed gas may be in a range of about zero to about 2.0.

In an exemplary embodiment, the signal electrode may include titanium or titanium oxide.

In an exemplary embodiment, the providing the signal electrode may include providing a signal metal layer on the etch stopper, and etching a portion of the signal metal layer corresponding to an area between the end portions of the etch stopper to provide a source electrode and a drain electrode.

In an exemplary embodiment, the method may further include providing a protection layer on the passivation layer, forming a contact hole through the protection layer and the passivation layer, where the contact hole exposes a portion of the drain electrode, and providing a pixel electrode on the protection layer. The pixel electrode may be electrically connected to the drain electrode through the contact hole.

In an exemplary embodiment, a second area of the oxide semiconductor pattern which overlaps the signal electrode may have a carrier concentration in a range of about zero $cm^{-3}$ to about $10^{16}$ $cm^{-3}$.

In an exemplary embodiment, an area ratio of the first area with respect to the second area may be in a range of about 2 to about 8.

In an exemplary embodiment, the providing the signal electrode may include adjusting an area of the signal electrode which overlaps the etch stopper based on the area ratio.

In an exemplary embodiment, a width of the oxide semiconductor pattern may be in a range of about 10 micrometers to about 100 micrometers.

In an exemplary embodiment, the signal electrode may have a multi-layered structure including an upper metal pattern and a lower metal pattern.

According to one or more exemplary embodiment of the thin film transistor and the method of manufacturing the thin film transistor, a signal electrode may include titanium such that the thin film transistor is switching-adjustable and has high saturation mobility under high-H2 condition.

In such embodiments, an area ratio of a portion of a semiconductor pattern that overlaps the signal electrode on the etch stopper with respect to a portion of a semiconductor pattern that does not overlaps the signal electrode on the etch stopper may be adjusted to have a predetermined saturation mobility in a channel area of the thin film transistor.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION

Figure 1:
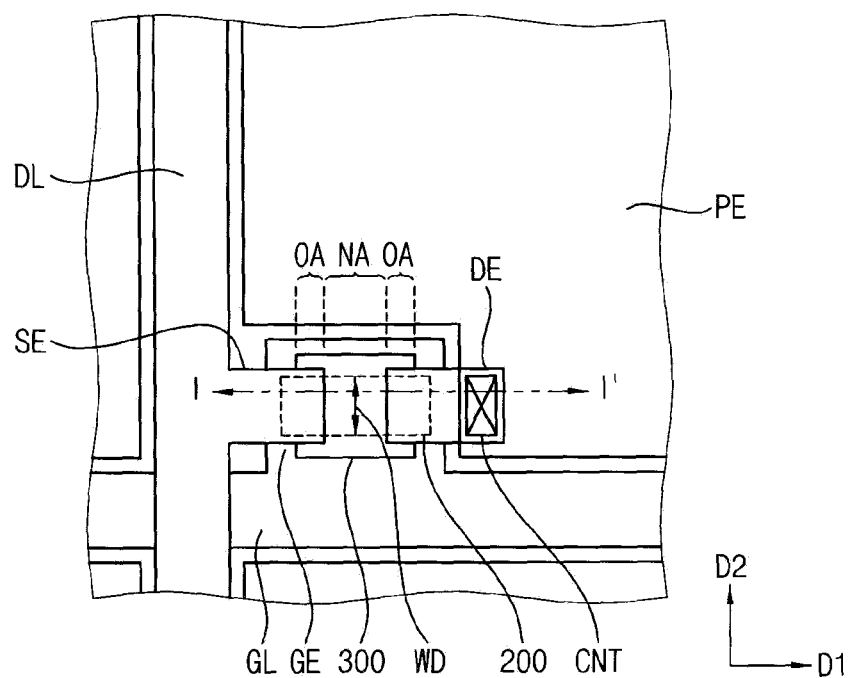
FIG. 1 is a plan view of an exemplary embodiment of a thin film transistor substrate according to the invention.

The invention will be described more fully hereinafter with reference to the accompanying drawings, in which exemplary embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

Figure 2:
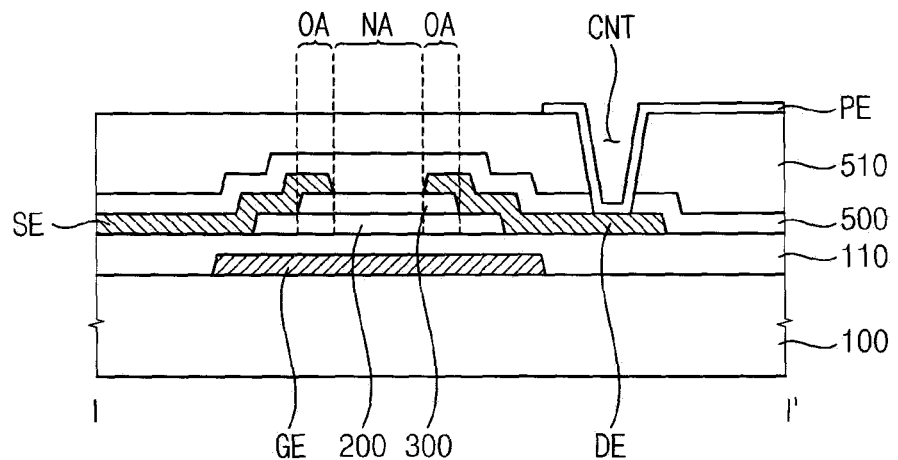
FIG. 2 is a cross-sectional view taken along line of I-I' of the thin film transistor substrate in FIG. 1.

FIG. 1 is a plan view of an exemplary embodiment of a thin film transistor substrate according to the invention. FIG. 2 is a cross-sectional view taken along line of I-I' of the thin film transistor substrate in FIG. 1.

Referring to FIGS. 1 and 2, an exemplary embodiment of a thin film transistor substrate according to the invention includes a substrate 100, a gate line GL, a data line DL, a thin film transistor, a protection layer 510 and a pixel electrode PE. The thin film transistor includes a gate electrode GE, a gate insulation layer 110, an oxide semiconductor pattern 200, an etch stopper 300, a signal electrode and a passivation layer 500.

In an exemplary embodiment, the substrate 100 includes a transparent conductive material. In one exemplary embodiment, for example, the substrate 100 may include glass, quartz, plastic, polyethylene terephthalate resin, polyethylene resin, polycarbonate resin, etc. In an exemplary embodiment, the substrate 100 may be a flexible substrate.

The gate line GL is disposed on the substrate 100 and extends substantially in a first direction D1. The gate line GL may include a copper layer. In an exemplary embodiment, the gate line GL may have a multi-layered structure of the copper layer and a conductive layer stacked on each other. The conductive layer may include copper oxide (CuOx), gallium doped zinc oxide ("GZO"), indium doped zinc oxide ("IZO") or copper-manganese alloy (CuMn), for example. A gate on/off signal may be applied to the gate line GL from a gate driving part (not shown) to drive the thin film transistor.

The gate electrode GE is electrically connected to the gate line GL. The gate electrode GE may include substantially the same material as the gate line GL. In one exemplary embodiment, for example, the gate electrode GE may be integrally formed with the gate line GL. In an alternative exemplary embodiment, the gate electrode GE may be spaced apart from the gate line GL by an insulation layer therebetween and may be electrically connected to the gate line GL through a contact hole in the insulation layer.

The gate insulation layer 110 is disposed on the substrate 100, on which the gate electrode GE is disposed. The gate insulation layer 110 covers the gate line GL and the gate electrode GE. In an exemplary embodiment, the gate insulation layer 110 may include silicon oxide or silicon nitride, for example.

The data line DL is disposed on the substrate 100 and extends substantially in a second direction D2, which is perpendicular to the first direction D1. The data line DL may include titanium (Ti) or titanium oxide (TiOx), for example. According to exemplary embodiments, the data line DL may have a single-layered structure including a single metal layer or a multi-layered structure including a plurality of metal layers. In one exemplary embodiment, for example, the data line DL may have a first metal pattern including titanium (Ti) and a second metal pattern including aluminum (Al), copper (Cu), molybdenum (Mo), tantalum (Ta), tungsten (W), neodymium (Nd), chromium (Cr) or silver (Ag). In one exemplary embodiment, for example, the data line DL includes a copper (Cu) layer and a titanium (Ti) layer under the copper (Cu) layer.

The oxide semiconductor pattern 200 is disposed on the substrate 100 on which the gate insulation layer 110 is disposed. The oxide semiconductor pattern 200 has a predetermined width WD along the second direction D2 and overlaps the gate electrode GE. The predetermined width WD of the oxide semiconductor pattern 220 may be in a range of about 10 micrometers (μm) to about 100 micrometers (μm). In an exemplary embodiment, the oxide semiconductor pattern 200 may include indium (In), zinc (Zn), gallium (Ga), tin (Sn) or hafnium (Hf). In one exemplary embodiment, for example, the oxide semiconductor pattern 200 may include indium gallium zinc oxide ("IGZO"), indium tin zinc oxide ("ITZO") or hafnium indium zinc oxide ("HIZO").

The oxide semiconductor pattern 200 includes a first area NA and a second area OA, which are defined based on a carrier concentration along the first direction D1. The first area NA may have a carrier concentration in a range of about $10^{17}$ per cubic centimeters ($cm^{-3}$) to about $10^{19}$ per cubic centimeters ($cm^{-3}$). The second area OA may have a carrier concentration in a range of about zero (0) $cm^{-3}$ to about $10^{16}$ $cm^{-3}$. Accordingly, in such an embodiment, the first area NA may have a relatively high conductivity while the second area OA has a relatively low conductivity. Thus, the oxide semiconductor pattern 200 has semiconductive properties due to the conductivity difference of the first area NA and the second area OA. Conductive properties of the oxide semiconductor pattern 200 will be described later in greater detail with reference to FIGS. 3A and 3B.

In an exemplary embodiment, a ratio of the first area NA and the second area OA of the oxide semiconductor pattern 200 has a predetermined area ratio R. In such an embodiment, the oxide semiconductor pattern 200 may be provided, e.g., formed, to have the predetermined area ratio R such that the predetermined area ratio R is substantially equal to a predetermined value or substantially within a predetermined range, where the predetermined area ratio R is defined as a ratio of the first area NA with respect to the second area OA (e.g., R=(area of NA)/(area of OA)). In one exemplary embodiment, for example, the predetermined area ratio R of the first area NA with respect to the second area OA may be in a range of about 2 to about 8.

The etch stopper 300 is disposed on the substrate 100, on which the oxide semiconductor pattern 200 is provided. The etch stopper 300 partially overlaps the oxide semiconductor pattern 200 and covers both the first area OA and the second area NA. In one exemplary embodiment, for example, an exposed portion of the etch stopper 300, which is not covered by the signal electrode, may overlap the first area NA of the oxide semiconductor pattern 200. In such an embodiment, another portion of the etch stopper 300, which is covered by the signal electrode, may overlap the second area OA of the oxide semiconductor pattern 200. The etch stopper 300 may include an insulation material such as silicon oxide, for example.

The signal electrode includes a source electrode SE and a drain electrode DE. The source electrode SE is disposed on the substrate 100, on which the etch stopper 300 is disposed. The source electrode SE overlaps an end portion (e.g., a first end portion) of the second area OA. The drain electrode DE is disposed on the substrate 100 on which the etch stopper 300 is disposed. The drain electrode DE overlaps another end portion (e.g., a second end portion opposite to the first end portion) of the second area OA. The source electrode SE and the drain electrode DE are spaced apart from each other by the first area NA therebetween. According to exemplary embodiments, the source electrode SE may include the same material as the drain electrode DE. In one exemplary embodiment, for example, the source electrode SE and the drain electrode DE may include titanium (Ti), titanium oxide (TiOx), etc. In an exemplary embodiment, as shown in FIG. 2, each of the source electrode SE and the drain electrode DE has a single-layered structure, but structures of the source electrode SE and the drain electrode DE are not limited thereto. In an alternative exemplary embodiment, the source electrode SE and the drain electrode DE may have multi-layered structures including a plurality of metal layers. In one exemplary embodiment, for example, the source electrode SE and the drain electrode DE may include a first metal pattern and a second metal pattern. In such an embodiment, the first metal pattern may include titanium (Ti), and the second metal pattern may include aluminum (Al), copper (Cu), molybdenum (Mo), tantalum (Ta), tungsten (W), neodymium (Nd), chromium (Cr) or silver (Ag), for example. In an exemplary embodiment, the first metal pattern and the second metal pattern may be stacked on each other. In one exemplary embodiment, for example, each of the source electrode SE and the drain electrode DE includes a copper (Cu) layer and a titanium (Ti) layer under the copper (Cu) layer.

The source electrode SE electrically connects the oxide semiconductor pattern 200 and the data line DL. The source electrode SE may directly contact an end portion (e.g., a first end portion) of the oxide semiconductor pattern 200. The source electrode SE may be integrally formed with the data line DL. In an alternative exemplary embodiment, the source electrode SE may be spaced apart from the data line DL by an insulation layer therebetween and may be electrically connected to the data line DL through a contact hole in the insulation layer.

The drain electrode DE electrically connects the oxide semiconductor pattern 200 (e.g., an end portion of the oxide semiconductor pattern 200) and the pixel electrode PE. The drain electrode DE may directly contact another end portion (e.g., a second end portion opposite to the first end portion) of the oxide semiconductor pattern 200.

In an exemplary embodiment, the passivation layer 500 is disposed on the substrate 100, on which the signal electrode is disposed. The passivation layer 500 covers the signal electrode and an exposed portion of the etch stopper 300 corresponding to the first area NA of the oxide semiconductor pattern 200. In one exemplary embodiment, for example, the passivation layer 500 may include silicon nitride (SiNx). In one exemplary embodiment, for example, the passivation layer 500 may be provided, e.g., formed, on the substrate 100 by a chemical vapor deposition ("CVD") process using a mixed gas of silicon hydride and ammonia ($NH_3$). In such an embodiment, a mixing ratio of ammonia ($NH_3$) with respect to silicon hydride of the mixed gas may be in a range of about zero (0) to about 2.0. In an exemplary embodiment, the passivation layer 500 may be deposited under high-H2 condition in the CVD process.

The protection layer 510 is disposed on the substrate 100 on which the passivation layer 500 is disposed. The protection layer 510 may have a substantially flat upper surface. The protection layer 510 may include an organic insulation material such as photoresist composition including acryl resin or phenol resin, for example.

The pixel electrode PE is electrically connected to the drain electrode DE through a contact hole CNT defined through the passivation layer 500 and the protection layer 510. The pixel electrode PE may include a transparent conductive material. In one exemplary embodiment, for example, the pixel electrode PE may include IZO, indium tin oxide ("ITO"), tin oxide (SnOx), zinc oxide (ZnOx), etc. In an alternative exemplary embodiment, the pixel electrode PE may include metal having high reflectivity. In one exemplary embodiment, for example, the pixel electrode PE may include aluminum (Al), platinum (Pt), silver (Ag), gold (Au), chromium (Cr), tungsten (W), molybdenum (Mo), titanium (Ti) or a combination thereof.

Figure 3A:
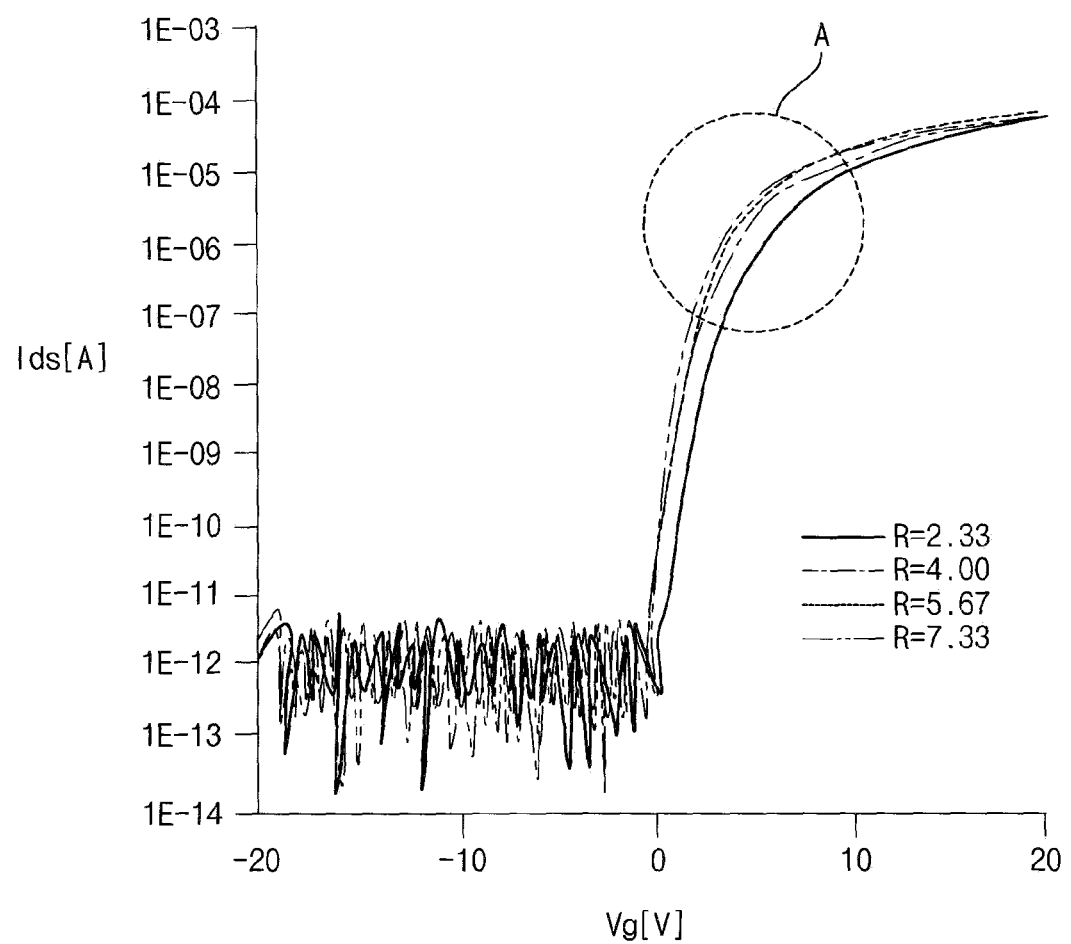
FIGS. 3A and 3B are graphs illustrating conductive properties of an exemplary embodiment of a thin film transistor of the thin film transistor substrate of FIG. 1.
Figure 3B:
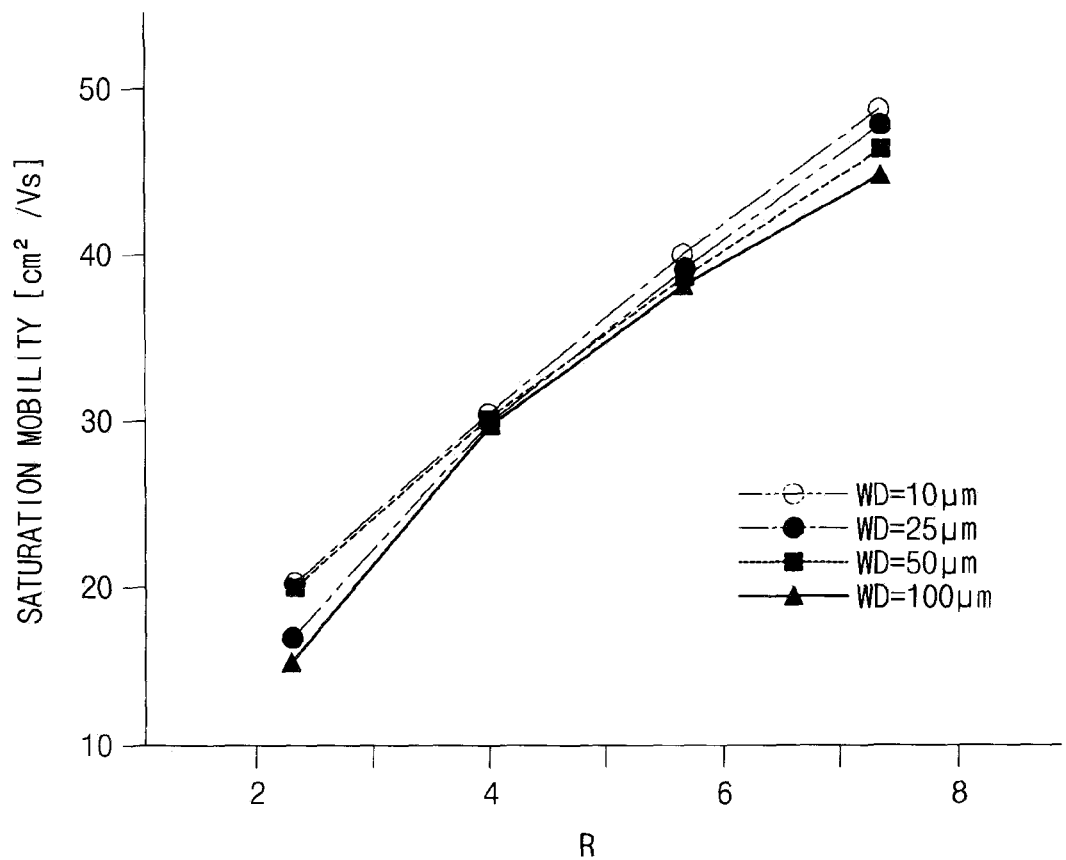

FIGS. 3A and 3B are graphs illustrating conductive properties of an exemplary embodiment of a thin film transistor of the thin film transistor substrate of FIG. 1. FIG. 3A is a graph illustrating current levels Ids (ampere: A) versus gate voltage Vg (volt: V) of the thin film transistor of FIG. 1, and FIG. 3B is a graph illustrating saturation mobilities (cubic centimeter per volt second: $cm^2/Vs$) of the oxide semiconductor pattern corresponding to portion A of FIG. 3A versus area ratio R of the first area NA with respect to the second area OA of the oxide semiconductor pattern.

Referring to FIG. 3A, current level Ids of an exemplary embodiment of a thin film transistor according to the invention is substantially increased when the gate voltage Vg is in a range of about zero (0) volt to about 10 volts. In an exemplary embodiment, when the area ratio R of the thin film transistor is substantially great, the current level Ids may rapidly arrive at a predetermined current level when the gate voltage Vg is less than about 10 volts.

Referring to FIG. 3B, the saturation mobility with respect to the area ratio R increases regardless of a width WD of the oxide semiconductor pattern. In one exemplary embodiment, for example, when the width WD of the oxide semiconductor pattern is between about 10 micrometers and about 100 micrometers, the saturation mobility of the oxide semiconductor pattern increases from about 20 $cm^2/Vs$ to substantially greater than about 40 $cm^2/Vs$ as the area ratio R increases from about 2 to about 8.

As described above, in an exemplary embodiment of the thin film transistor substrate, the signal electrode may include titanium such that the thin film transistor is switching-adjustable and has high saturation mobility under high-H2 condition. In such an embodiment, the area ratio of a portion of the semiconductor pattern that overlaps the signal electrode on the etch stopper with respect to a portion of the semiconductor pattern that does not overlaps the signal electrode on the etch stopper may be adjusted to have a predetermined saturation mobility in a channel area of the thin film transistor.

FIGS. 4A to 4K are cross-sectional views illustrating an exemplary embodiment of a method of manufacturing the thin film transistor substrate of FIG. 1.

Figure 4A:
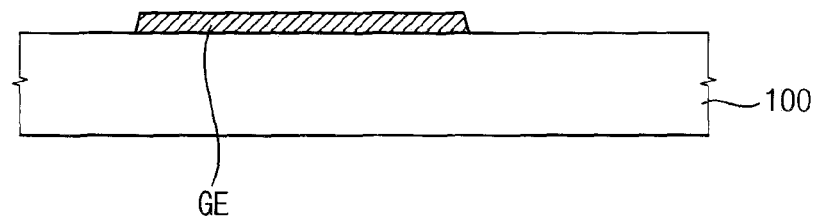
FIGS. 4A to 4K are cross-sectional views illustrating an exemplary embodiment of a method of manufacturing the thin film transistor substrate of FIG. 1.

Referring to FIG. 4A, a gate metal layer is provided, e.g., formed, on a substrate 100, and the gate metal layer is patterned to form a gate electrode GE. The gate metal layer may include a copper (Cu) layer. In an exemplary embodiment, the gate line GL may have a multi-layered structure of the copper layer and a conductive layer stacked on each other. In such an embodiment, the conductive layer may include copper oxide (CuOx), GZO, IZO or copper-manganese alloy (CuMn), for example.

Figure 4B:
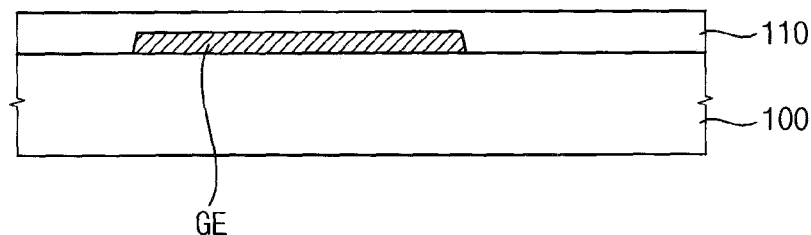

Referring to FIG. 4B, a gate insulation layer 110 is provided, e.g., formed, on the substrate 100 on which the gate electrode GE is provided. In an exemplary embodiment, the gate insulation layer 110 may include an inorganic material such as silicon nitride (SiNx) and silicon oxide (SiOx), for example. In an alternative exemplary embodiment, the gate insulation layer 110 may include a transparent organic material. The gate insulation layer 110 may be provided by a CVD process or an organic layer coating process.

Figure 4C:
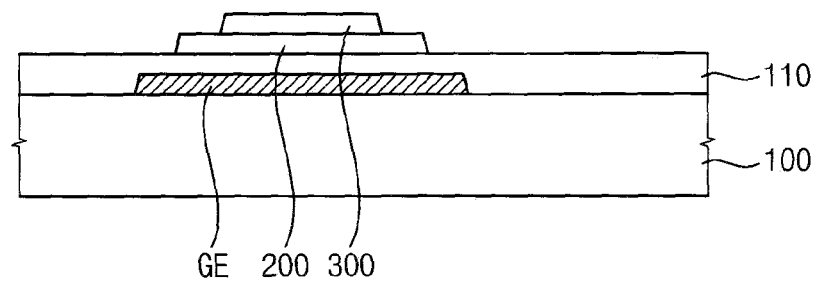

Referring to FIG. 4C, an oxide semiconductor pattern 200 is provided on the substrate 100 on which the gate insulation layer 110 is provided. An etch stopper 300 is provided on the oxide semiconductor pattern 200 such that the etch stopper 300 partially overlaps the oxide semiconductor pattern 200. The oxide semiconductor pattern 200 overlaps the gate electrode GE and has a predetermined width WD. The width WD of the oxide semiconductor pattern 200 may be in a range of about 10 micrometers to about 100 micrometers. In an exemplary embodiment, the oxide semiconductor pattern 200 may include indium (In), zinc (Zn), gallium (Ga), tin (Sn) or hafnium (Hf), for example. In one exemplary embodiment, for example, the oxide semiconductor pattern 200 may include IGZO, ITZO, HIZO, etc. In one exemplary embodiment, for example, the etch stopper 300 may include an insulation material such as silicon oxide (SiOx). In such an embodiment, as described above, a portion of the oxide semiconductor pattern 200 that overlaps the etch stopper 300 includes the first area NA and the second area OA, which will be described in greater detail with reference to FIGS. 4G and 4H.

Figure 4D:
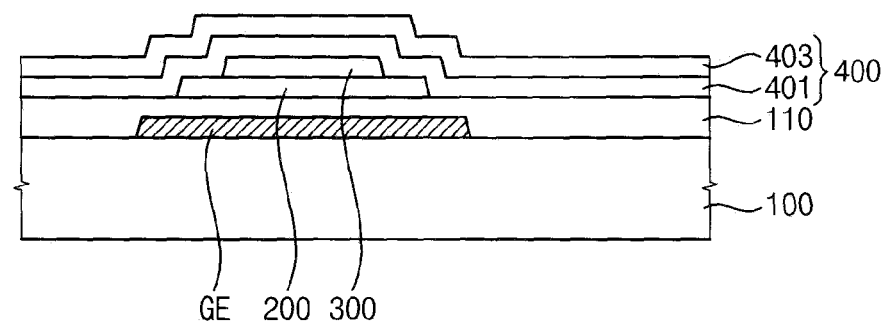

Referring to FIG. 4D, a signal metal layer 400 is provided on the substrate 100 on which the etch stopper 300 is provided. The signal metal layer 400 may include a lower layer 401 and an upper layer 403. In an exemplary embodiment, the signal metal layer 400 may include titanium (Ti) or titanium oxide (TiOx), for example. In one exemplary embodiment, for example, the lower layer 401 may include titanium (Ti), and the upper layer 403 may include aluminum (Al), copper (Cu), molybdenum (Mo), tantalum (Ta), tungsten (W), neodymium (Nd), chromium (Cr) or silver (Ag), etc. In an alternative exemplary embodiment, the upper layer 403 may include titanium (Ti), and the lower layer 401 may include aluminum (Al), copper (Cu), molybdenum (Mo), tantalum (Ta), tungsten (W), neodymium (Nd), chromium (Cr) or silver (Ag), etc. In an exemplary embodiment, each of the upper layer 403 and the lower layer 401 includes a copper (Cu) layer and a titanium (Ti) layer under the copper (Cu) layer.

Figure 4E:
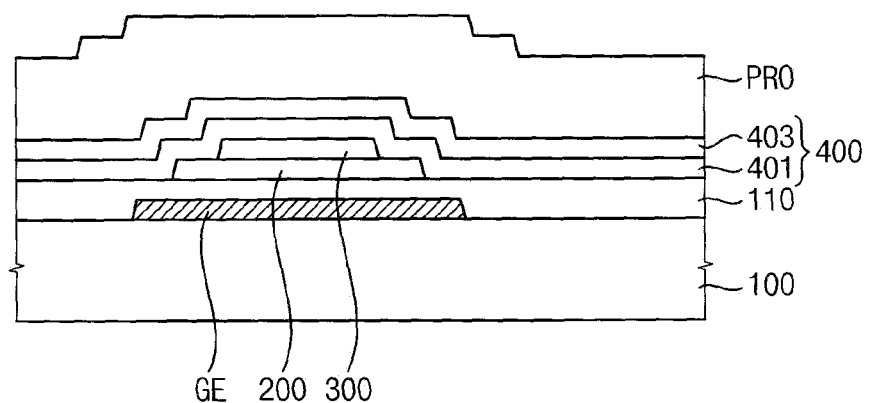

Referring to FIG. 4E, a photoresist layer PR0 is provided, e.g., formed, on the substrate 100 on which the signal metal layer 400 is provided. The photoresist layer PR0 may include, for example, positive-type photoresist composition whose area illuminated by light is removed by developer and whose area non-illuminated by the light is hardened to remain. In an exemplary embodiment, the photoresist layer PR0 may be provided on the signal metal layer 400 by spin-coating or slit-coating processes.

Figure 4F:
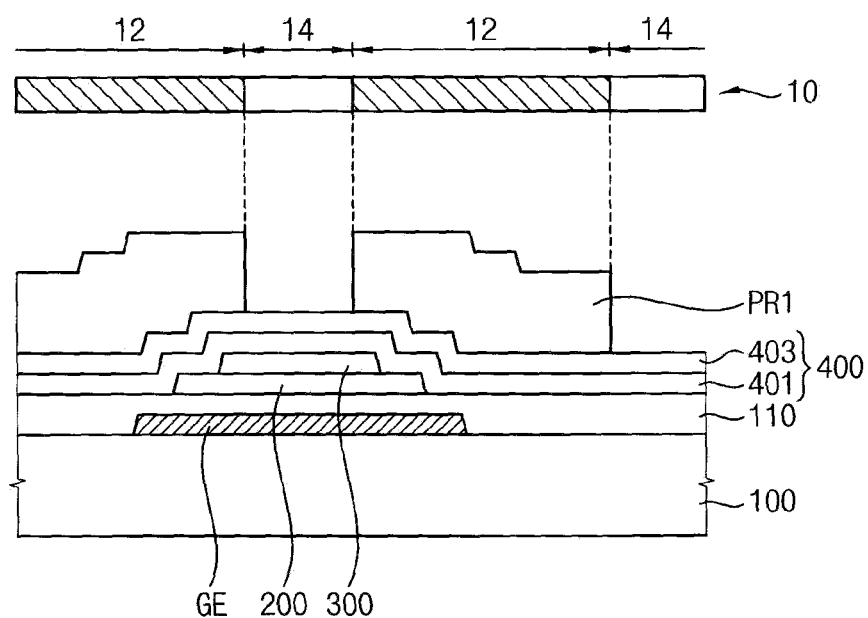

Referring to FIG. 4F, a mask 10 is disposed on the substrate 100 on which the photoresist layer PR0 is provided. The mask 10 includes a light blocking portion 12 and an opening portion 14. The light blocking portion 12 of the mask 10 may be disposed to correspond to a source area, a drain area and a data line area of the thin film transistor substrate. The opening portion 14 of the mask 10 may be disposed to correspond to a remaining area of the thin film transistor substrate except for the source area, the drain area and the data line area. In one exemplary embodiment, for example, the opening portion 14 of the mask 10 may correspond to a pixel area and a portion of the etch stopper 300.

Then, light having a predetermined wavelength is illuminated above the mask 10 toward the substrate 100 on which the photoresist layer PR0 is provided. A portion of the positive-type photoresist composition, which is not hardened by the light, is removed by developer. Accordingly, a photoresist pattern PR1 is provided on the signal metal layer 400.

In an alternative exemplary embodiment, the photoresist layer PR0 may include negative-type photoresist composition whose area illuminated by light is hardened to remain and whose area non-illuminated by the light is removed by developer. In such an embodiment, an arrangement of the light blocking portion 12 and the opening portion 14 of the mask 10 may be reversed.

Figure 4G:
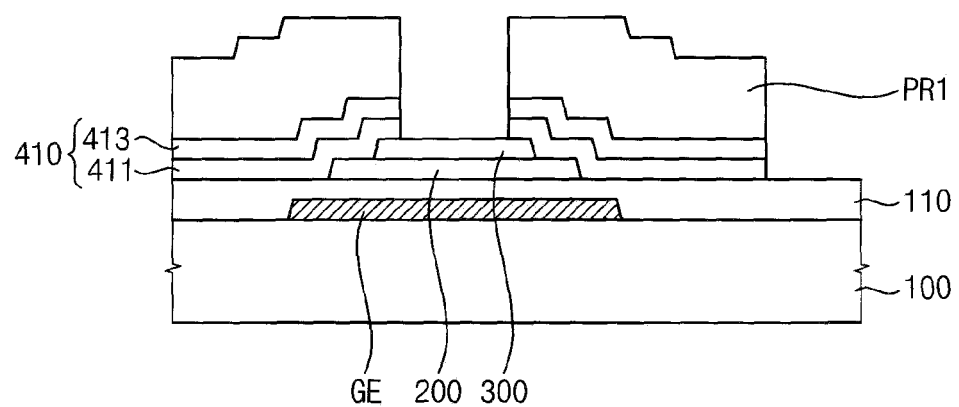
Figure 4H:
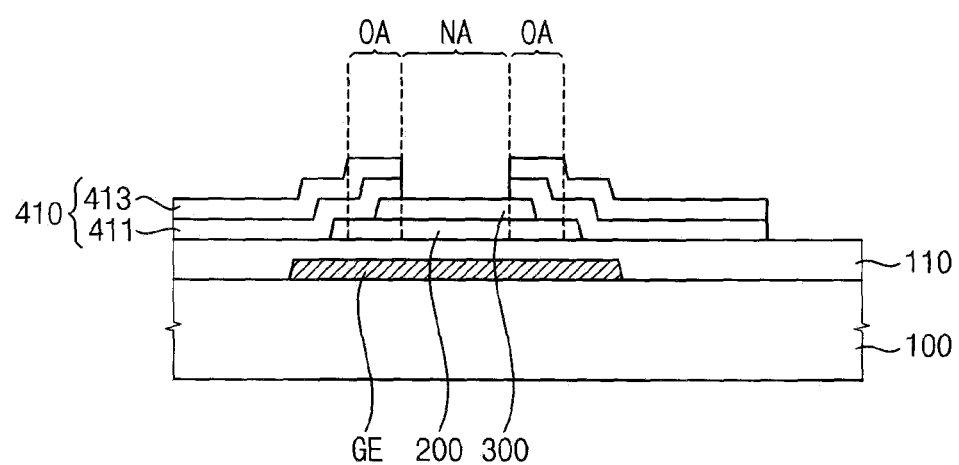

Referring to FIGS. 4G and 4H, a signal electrode 410 is provided by etching the signal metal layer 400 using the photoresist pattern PR1 as a mask. The etching process of the signal metal layer 400 may include dry etching or wet etching processes. Then, the photoresist pattern PR1 is removed from the signal electrode 410.

The signal electrode 410 includes an upper metal pattern 413 and a lower metal pattern 411. In such an embodiment, as shown in FIG. 2, the signal electrode 410 includes a source electrode SE and a drain electrode DE. The source electrode SE contacts an end portion (e.g., a first end portion) of the oxide semiconductor pattern 200 and partially covers the etch stopper 300. The drain electrode DE contacts another end portion (e.g., a second end portion opposite to the first end portion) of the oxide semiconductor pattern 200 and partially covers the etch stopper 300. The semiconductor pattern 200 includes the first area NA that overlaps the etch stopper 300, and a second area OA that overlaps both the etch stopper 300 and the signal electrode 410. The first area NA and the second area OA have a predetermined area ratio R. In one exemplary embodiment, for example, the area ratio R of the first area NA with respect to the second area OA (i.e., R=(area of NA)/(area of OA)) may be in a range of about 2 to about 8. According to exemplary embodiments, the area ratio R may be adjusted to have a predetermined value or to be in a predetermined range.

Figure 4I:
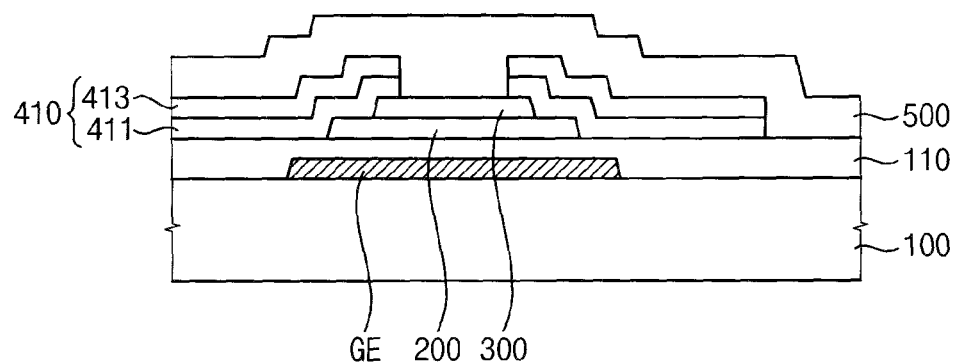

Referring to FIG. 4I, a passivation layer 500 is provided on the substrate 100 on which the signal electrode 410 is provided. In an exemplary embodiment, the passivation layer 500 may be formed by a deposition process using a mixed gas of silicon hydride and ammonia ($NH_3$). In one exemplary embodiment, for example, the passivation layer 500 may be formed by a CVD process. In such an embodiment, a mixing ratio of ammonia ($NH_3$) with respect to silicon hydride of the mixed gas may be in a range of about zero (0) to about 2.0. In such an embodiment, the passivation layer 500 may be deposited under high-H2 condition in the CVD process.

During the CVD process of the passivation layer 500, hydrogen in the mixed gas is diffused to the first area NA of the oxide semiconductor pattern 200 that overlaps the etch stopper 300. Accordingly, concentration of n-type carrier in the first area NA is increased. In the CVD process, hydrogen in the mixed gas is blocked to diffuse in the second area OA of the oxide semiconductor pattern 200 that overlaps both the etch stopper 300 and the signal electrode 410 due to titanium (Ti) in the signal electrode 410. Accordingly, a concentration of n-type carrier in the second area OA is less increased than a concentration of n-type carrier in the first area NA. In one exemplary embodiment, for example, the first area NA may have a carrier concentration in a range of about $10^{17}$ $cm^{-3}$ to about $10^{19}$ $cm^{-3}$. The second area OA may have a carrier concentration in a range of about zero (0) $cm^{-3}$ to about $10^{16}$ $cm^{-3}$. As mentioned above, in such an embodiment, conductive properties of the oxide semiconductor pattern 200 is adjusted based on the area ratio R of the first area NA and the second area OA such that semiconductive properties under high H2 condition is effectively maintained without shorting the thin film transistor.

Figure 4J:
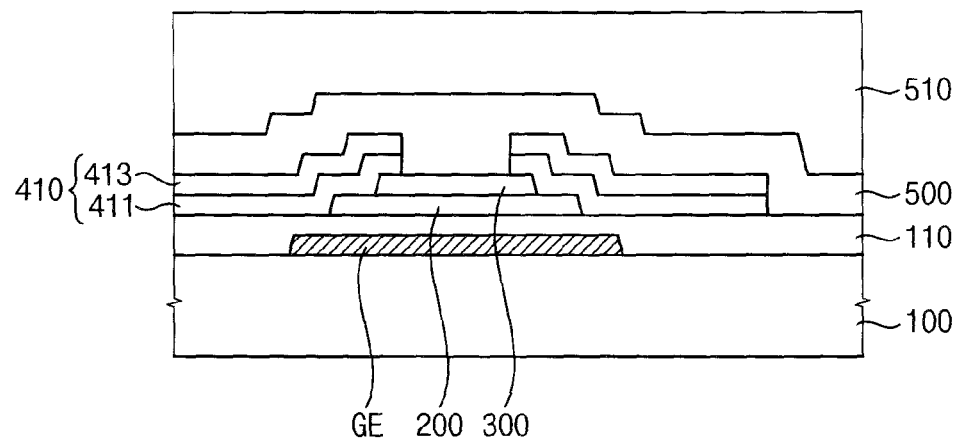

Referring to FIG. 4J, a protection layer 510 is provided on the substrate 100 on which the passivation layer 500 is provided. In an exemplary embodiment, the protection layer 510 may have a substantially flat upper surface. The protection layer 510 may include an organic insulation layer having photoresist composition such as acryl resin or phenol resin, for example.

Figure 4K:
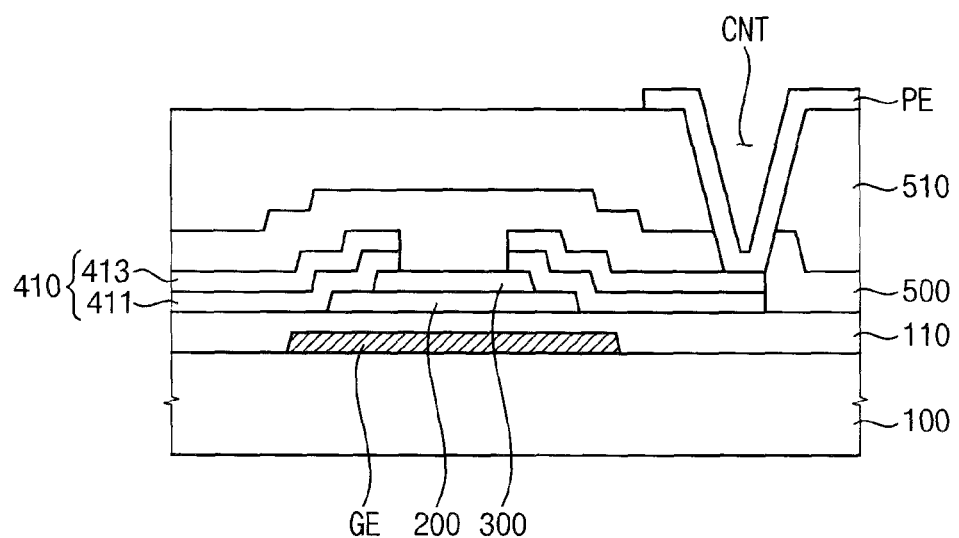

Referring to FIG. 4K, a contact hole CNT is provided in the protection layer 510, and a pixel electrode PE is provided on the protection layer 510. The pixel electrode PE contacts the drain electrode DE through the contact hole CNT. The contact hole CNT is defined through the protection layer 510 and the passivation layer 500 corresponding to a portion of the drain electrode DE. In an exemplary embodiment, the pixel electrode PE may include a transparent conductive material. In one exemplary embodiment, for example, the pixel electrode PE may include IZO, ITO, tin oxide (SnOx) or zinc oxide (ZnOx), etc. In one exemplary embodiment, for example, the pixel electrode PE may include aluminum (Al), platinum (Pt), silver (Ag), gold (Au), chromium (Cr), tungsten (W), molybdenum (Mo), titanium (Ti) or a combination thereof.

Figure 5:
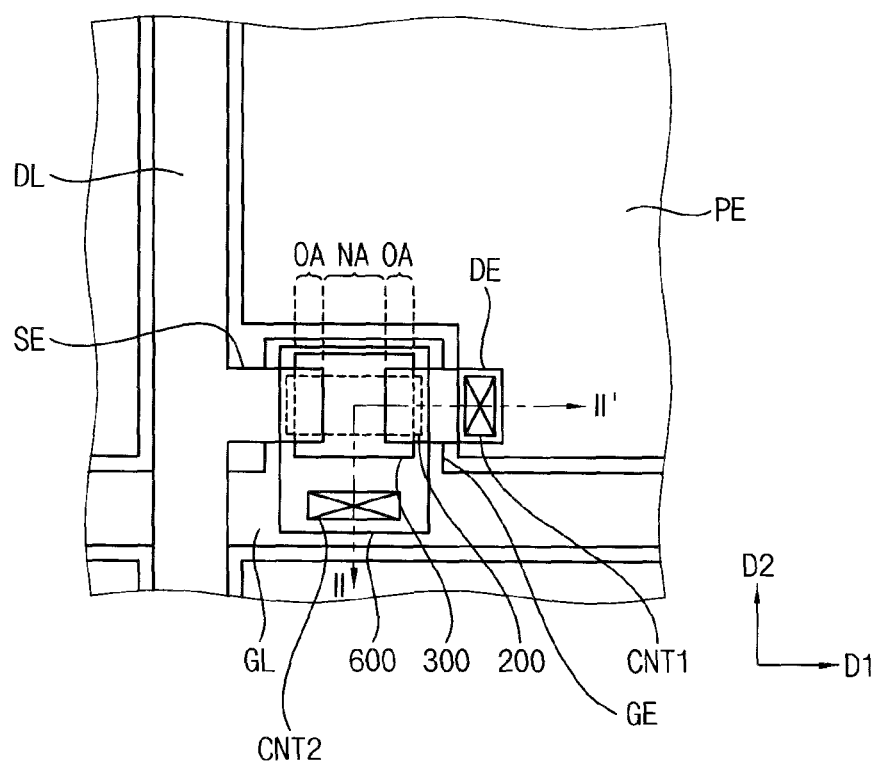
FIG. 5 is a plan view illustrating an alternative exemplary embodiment of a thin film transistor substrate according to the invention.
Figure 6:
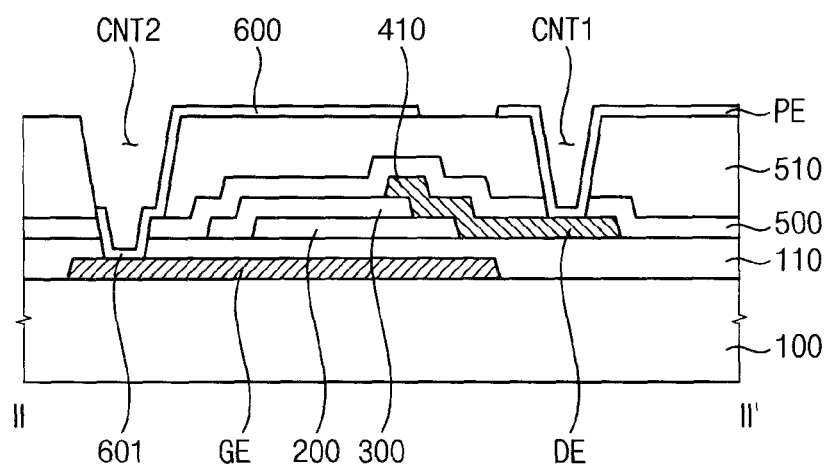
FIG. 6 is a cross-sectional view taken along line of II-II' of the thin film transistor substrate shown in FIG. 5.

FIG. 5 is a plan view illustrating an alternative exemplary embodiment of a thin film transistor substrate according to the invention. FIG. 6 is a cross-sectional view taken along line of II-II' of the thin film transistor substrate in FIG. 5.

Referring to FIGS. 5 and 6, an exemplary embodiment of a thin film transistor substrate according to the invention includes a substrate 100, a gate line GL, a data line DL, a thin film transistor, a protection layer 510, a second gate electrode 600 and a pixel electrode PE. The thin film transistor includes a first gate electrode GE, a gate insulation layer 110, an oxide semiconductor pattern 200, an etch stopper 300, a signal electrode and a passivation layer 500. The thin film transistor substrate shown in FIGS. 5 and 6 is substantially the same as the thin film transistor substrate illustrated in FIGS. 1 and 2 except that the thin film transistor has a dual gate structure having the first gate electrode GE and the second gate electrode 600 electrically connected to the first gate electrode. Thus, any repetitive detailed description of identical elements will hereinafter be omitted or simplified.

In an exemplary embodiment, the substrate 100 includes a transparent conductive material. In one exemplary embodiment, for example, the substrate 100 may include glass or plastic. In an exemplary embodiment, the substrate 100 may be a flexible substrate.

The gate line GL is disposed on the substrate 100 and extends substantially in a first direction D1. The gate line GL may include copper (Cu) layer. In an exemplary embodiment, the gate line GL may have a multi-layered structure of the copper layer and a conductive layer stacked on each other. In such an embodiment, the conductive layer may include copper oxide (CuOx), GZO, IZO or copper-manganese alloy (CuMn), for example.

The first gate electrode GE is electrically connected to the gate line GL. The first gate electrode GE may include substantially the same material as the gate line GL.

The gate insulation layer 110 is disposed on the substrate 100 on which the first gate electrode GE is disposed. The gate insulation layer 110 may include silicon oxide or silicon nitride, for example.

The data line DL is disposed on the substrate 100 and extends substantially in a second direction D2 perpendicular to the first direction D1. The data line DL may include titanium (Ti) or titanium oxide (TiOx), for example. According to exemplary embodiments, the data line DL may have a single-layered structure including a single metal layer or a multi-layered structure including a plurality of metal layers.

The oxide semiconductor pattern 200 is disposed on the substrate 100 on which the gate insulation layer 110 is disposed. The oxide semiconductor pattern 200 has a predetermined width WD along the second direction D2 and overlaps the gate electrode GE. In an exemplary embodiment, the oxide semiconductor pattern 200 may include indium (In), zinc (Zn), gallium (Ga), tin (Sn) or hafnium (Hf), for example. In one exemplary embodiment, for example, the oxide semiconductor pattern 200 may include IGZO, ITZO, HIZO, etc.

The oxide semiconductor pattern 200 includes a first area NA and a second area OA, which are defined based on a carrier concentration along the first direction D1. The first area NA may have a carrier concentration in a range of about $10^{17}$ cm$^{-3}$ to about $10^{19}$ cm$^{-3}$. The second area OA may have a carrier concentration in a range of about zero (0) cm$^{-3}$ to about $10^{16}$ cm$^{-3}$. Accordingly, the first area NA may have a relatively high conductivity while the second area OA has a relatively low conductivity. Thus, the oxide semiconductor pattern 200 has semiconductive properties due to the conductivity difference of the first area NA and the second area OA.

In an exemplary embodiment, the oxide semiconductor pattern 200 has a predetermined area ratio R of the first area NA and the second area OA. In such an embodiment, the oxide semiconductor pattern 200 may be provided to have the predetermined area ratio R such that the area ratio R is substantially equal to a predetermined value or substantially in a predetermined range where the area ratio R represents a ratio of the first area NA with respect to the second area OA (i.e., R=(area of NA)/(area of OA)). In one exemplary embodiment, for example, the area ratio R of the first area NA with respect to the second area OA may be in a range of about 2 to about 8.

The etch stopper 300 is disposed on the substrate 100 on which the oxide semiconductor pattern 200 is disposed. The etch stopper 300 partially overlaps the oxide semiconductor pattern 200 and covers both the first area OA and the second area NA. In one exemplary embodiment, for example, an exposed portion of the etch stopper 300 not covered by the signal electrode may overlap the first area NA of the oxide semiconductor pattern 200, and another portion of the etch stopper 300 covered by the signal electrode may overlap the second area OA of the oxide semiconductor pattern 200. In one exemplary embodiment, for example, the etch stopper 300 may include an insulation material such as silicon oxide.

The signal electrode includes a source electrode SE and a drain electrode DE. The source electrode SE is disposed on the substrate 100 on which the etch stopper 300 is disposed. The source electrode SE overlaps an end portion (e.g., a first end portion) of the second area OA. The drain electrode DE is disposed on the substrate 100 on which the etch stopper 300 is disposed. The drain electrode DE overlaps another end portion (e.g., a second end portion opposite to the first end portion) of the second area OA. The source electrode SE and the drain electrode DE are spaced apart from each other by the first area NA therebetween. According to exemplary embodiments, the source electrode SE may include the same material as the drain electrode DE. In one exemplary embodiment, for example, the source electrode SE and the drain electrode DE may include titanium (Ti), titanium oxide (TiOx), etc. In an exemplary embodiment, each of the source electrode SE and the drain electrode DE includes a copper (Cu) layer and a titanium (Ti) layer under the copper (Cu) layer.

The source electrode SE electrically connects the oxide semiconductor pattern 200 and the data line DL. The source electrode SE may directly contact an end portion (e.g., a first end portion) of the oxide semiconductor pattern 200. The source electrode SE may be integrally formed with the data line DL.

The drain electrode DE electrically connects the oxide semiconductor pattern 200 and the pixel electrode PE. The drain electrode DE may directly contact another end portion (e.g., a second end portion opposite to the first end portion) of the oxide semiconductor pattern 200.

The passivation layer 500 is disposed on the substrate 100 on which the signal electrode is disposed. The passivation layer 500 covers the signal electrode and an exposed portion of the etch stopper 300 corresponding to the first area NA of the oxide semiconductor pattern 200. In one exemplary embodiment, for example, the passivation layer 500 may include silicon nitride (SiNx). In one exemplary embodiment, for example, the passivation layer 500 may be formed on the substrate 100 by a CVD process using a mixed gas of silicon hydride and ammonia (NH$_3$). In such an embodiment, a mixing ratio of ammonia (NH$_3$) with respect to silicon hydride of the mixed gas may be in a range of about zero (0) to about 2.0. In such an embodiment, the passivation layer 500 may be deposited under high-H2 condition in the CVD process.

The protection layer 510 is disposed on the substrate 100 on which the passivation layer 500 is disposed. The protection layer 510 may have a substantially flat upper surface. The protection layer 510 may include an organic insulation material such as photoresist composition including acryl resin or phenol resin, for example.

The pixel electrode PE is electrically connected to the drain electrode DE through a first contact hole CNT1 defined through the passivation layer 500 and the protection layer 510. The pixel electrode PE may include a transparent conductive material. In one exemplary embodiment, for example, the pixel electrode PE may include IZO, ITO, tin oxide (SnOx), zinc oxide (ZnOx), etc. In an alternative exemplary embodiment, the pixel electrode PE may include a metal having high reflectivity. In one exemplary embodiment, for example, the pixel electrode PE may include aluminum (Al), platinum (Pt), silver (Ag), gold (Au), chromium (Cr), tungsten (W), molybdenum (Mo), titanium (Ti) or a combination thereof.

The second gate electrode 600 is disposed on the substrate 100 on which the protection layer 510 is formed. A portion of the second gate electrode 600 is electrically connected to the first gate electrode GE through a second contact hole CNT2. A gate on/off signal may be applied to the second gate electrode 600 and the first gate electrode GE. In this case, the second gate electrode 600 controls an upper channel area of the oxide semiconductor pattern 200 and the first gate electrode GE controls a lower channel area of the oxide of the semiconductor pattern 200.

The second gate electrode 600 may be formed of substantially the same material as the pixel electrode PE. In one exemplary embodiment, for example, the second gate electrode 600 may include IZO, ITO, tin oxide (SnOx), zinc oxide (ZnOx), aluminum (Al), platinum (Pt), silver (Ag), gold (Au), chromium (Cr), tungsten (W), molybdenum (Mo), titanium (Ti) or a combination thereof.

As described above, according to an exemplary embodiment of the thin film transistor substrate, a signal electrode may include titanium such that the thin film transistor is switching-adjustable and has high saturation mobility under high-H2 condition. In such an embodiment, the area ratio of a portion of the semiconductor pattern that overlaps the signal electrode on the etch stopper with respect to a portion of the semiconductor pattern that does not overlaps the signal electrode on the etch stopper may be adjusted to have a predetermined saturation mobility in a channel area of the thin film transistor.

FIGS. 7A to 7E are cross-sectional views illustrating an exemplary embodiment of a method of manufacturing the thin film transistor substrate of FIG. 5.

Figure 7A:
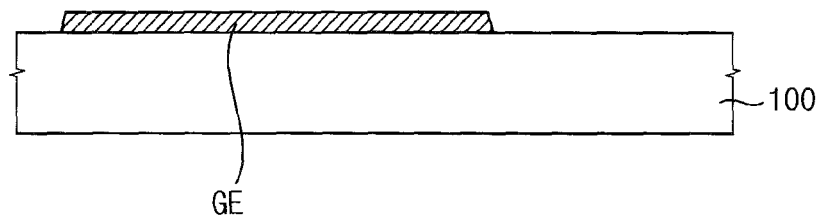
FIGS. 7A to 7E are cross-sectional views illustrating an exemplary embodiment of a method of manufacturing the thin film transistor substrate of FIG. 5.

Referring to FIG. 7A, a gate metal layer is provided, e.g., formed, on a substrate 100, and then the gate metal layer is patterned to provide a first gate electrode GE. The gate metal layer may include a copper (Cu) layer.

Figure 7B:
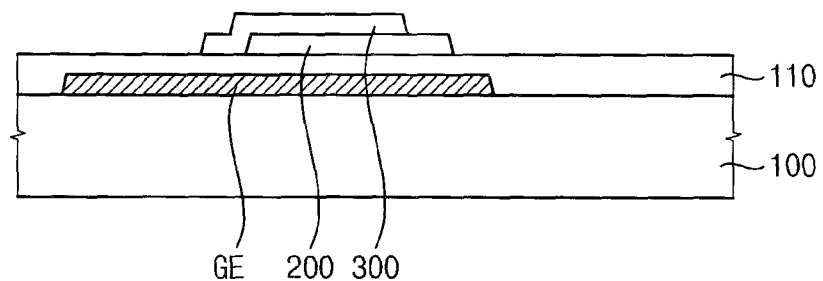

Referring to FIG. 7B, a gate insulation layer 110 is provided on the substrate 100 on which the first gate electrode GE is provided. An oxide semiconductor pattern 200 and an etch stopper 300 are sequentially provided on the gate insulation layer 110. The gate insulation layer 110 may include an inorganic material such as silicon nitride (SiNx) and silicon oxide (SiOx), for example. In an alternative exemplary embodiment, the gate insulation layer 110 may include a transparent organic material. The oxide semiconductor pattern 200 has a predetermined width and overlaps the first gate electrode GE. The etch stopper 300 partially overlaps the oxide semiconductor pattern 200. In an exemplary embodiment, the oxide semiconductor pattern 200 may include indium (In), zinc (Zn), gallium (Ga), tin (Sn), or hafnium (Hf). In one exemplary embodiment, for example, the oxide semiconductor pattern 200 may include IGZO, ITZO, HIZO, etc. In one exemplary embodiment, for example, the etch stopper 300 may include an insulation material such as silicon oxide (SiOx).

Figure 7C:
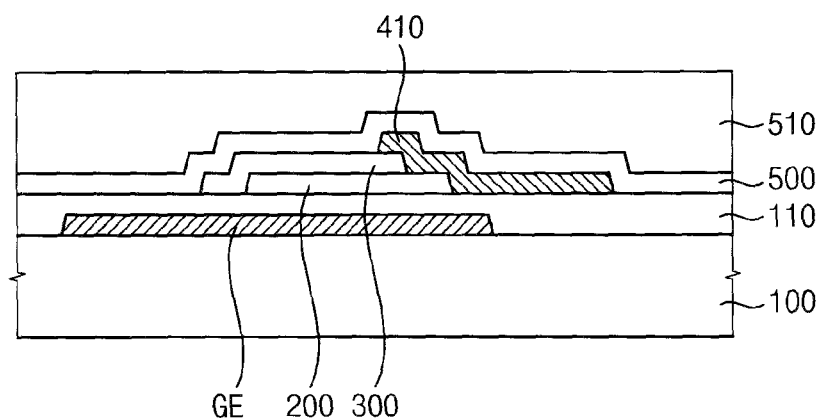

Referring to FIG. 7C, a signal metal layer 400 is provided on the substrate 100 on which the etch stopper 300 is provided. Then, the signal metal layer 400 is etched to form a signal electrode 410. The signal electrode 410 may include titanium (Ti) or titanium oxide (TiOx), for example. The signal electrode 410 includes a source electrode SE and a drain electrode DE. The source electrode SE contacts an end portion (e.g., a first end portion) of the oxide semiconductor pattern 200 and partially covers the etch stopper 300. The drain electrode DE contacts another end portion (e.g., a second end portion opposite to the first end portion) of the oxide semiconductor pattern 200 and partially covers the etch stopper 300. The semiconductor pattern 200 includes a first area NA that overlaps the etch stopper 300 and a second area OA that overlaps both the etch stopper 300 and the signal electrode 410. The first area NA and the second area OA have a predetermined area ratio R. In one exemplary embodiment, for example, the area ratio R of the first area NA with respect to the second area OA (i.e., R=(area of NA)/(area of OA)) may be in a range of about 2 to about 8. According to exemplary embodiments, the area ratio R may be adjusted to have a predetermined value or to be in a predetermined range.

Then, a passivation layer 500 is provided on the substrate 100 on which the signal electrode 410 is provided. The passivation layer 500 may be provided, e.g., formed, by a deposition process using a mixed gas of silicon hydride and ammonia (NH$_3$). In one exemplary embodiment, for example, the passivation layer 500 may be formed by a chemical vapor deposition ("CVD") process. In such an embodiment, a mixing ratio of ammonia (NH$_3$) with respect to silicon hydride of the mixed gas may be in a range of about zero (0) to about 2.0. In such an embodiment, the passivation layer 500 may be deposited under high-H2 condition in the CVD process. As the passivation layer 500 is deposited on the substrate 100, conductive properties of a portion of the oxide semiconductor pattern 200 may be different from conductive properties of another portion of the oxide semiconductor pattern 200. In one exemplary embodiment, for example, the first area NA may have a carrier concentration in a range of about $10^{17}$ cm$^{-3}$ to about $10^{19}$ cm$^{-3}$. The second area OA may have a carrier concentration in a range of about zero (0) cm$^{-3}$ to about $10^{16}$ cm$^{-3}$.

Then, a protection layer 510 is provided on the substrate 100 on which the passivation layer 500 is provided. The protection layer 510 may have a substantially flat upper surface. The protection layer 510 may include an organic insulation layer having photoresist composition such as acryl resin or phenol resin, for example.

Figure 7D:
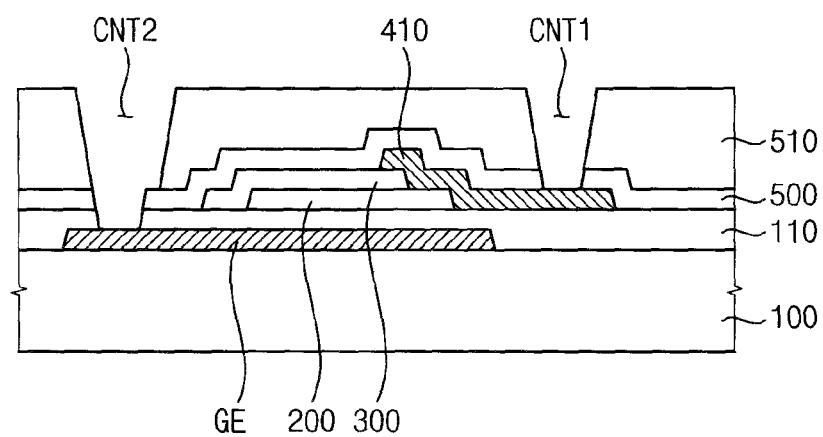

Referring to FIG. 7D, a first contact hole CNT1 and a second contact hole CNT2 are formed in the protection layer 510. In such an embodiment, as shown in FIG. 6, the first contact hole CNT1 is defined through the protection layer 510 and the passivation layer 500 corresponding to a portion of the drain electrode DE. The second contact hole CNT2 is defined through the protection layer 510, the passivation layer 500 and the gate insulation layer 110 corresponding to an end portion of the first gate electrode GE.

Figure 7E:
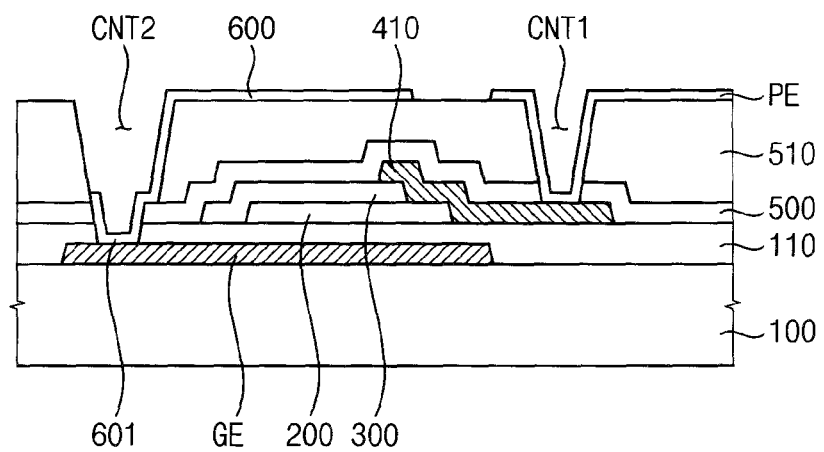

Referring to FIG. 7E, a pixel electrode PE and a second gate electrode 600 are provided on the protection layer 510. The pixel electrode PE contacts the drain electrode DE through the first contact hole CNT1. The second gate electrode 600 contacts the first gate electrode GE through the second contact hole CNT2.

In an exemplary embodiment, the pixel electrode PE may include a transparent conductive material. The second gate electrode 600 may include substantially the same material as the pixel electrode PE. In one exemplary embodiment, for example, the pixel electrode PE and the second gate electrode 600 may include IZO, ITO, tin oxide (SnOx), zinc oxide (ZnOx), etc. In an alternative exemplary embodiment, the pixel electrode PE and the second gate electrode 600 may include a metal having high reflectivity such as aluminum (Al), platinum (Pt), silver (Ag), gold (Au), chromium (Cr), tungsten (W), molybdenum (Mo), titanium (Ti), or a combination thereof, for example.

According to one or more exemplary embodiment of the thin film transistor and the method of manufacturing the thin film transistor, a signal electrode may include titanium such that the thin film transistor is switching-adjustable and has high saturation mobility under high-H2 condition.

In such embodiments, an area ratio of a portion of a semiconductor pattern that overlaps the signal electrode on the etch stopper with respect to another portion of a semiconductor pattern that does not overlaps the signal electrode on the etch stopper partially and covers the semiconductor pattern may be adjusted to have a predetermined saturation mobility in a channel area of the thin film transistor.

While the invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A thin film transistor substrate comprising:
   a substrate;
   a gate electrode disposed on the substrate;
   a gate insulation layer disposed on the gate electrode;
   an oxide semiconductor pattern disposed on the gate insulation layer, wherein the oxide semiconductor pattern comprises:
      a first area whose carrier concentration is in a range of about $10^{17}$ per cubic centimeter to about $10^{19}$ per cubic centimeter; and
      a second area whose carrier concentration is less than the carrier concentration of the first area;
   an etch stopper disposed on the oxide semiconductor pattern, wherein the etch stopper covers the first area and the second area of the oxide semiconductor pattern;
   a signal electrode which overlaps a portion of the etch stopper and the second area; and
   a passivation layer which covers the etch stopper and the signal electrode,
   wherein the first area and the second area are defined based on a respective carrier concentration along a length of the etch stopper in a top plan view so that both of the first area and the second area contact the etch stopper.

2. The thin film transistor substrate of claim 1, wherein the signal electrode comprises titanium or titanium oxide.

3. The thin film transistor substrate of claim 1, wherein the second area has a carrier concentration in a range of about zero per cubic centimeter to about $10^{16}$ per cubic centimeter.

4. The thin film transistor substrate of claim 1, wherein the signal electrode comprises:
   a source electrode which overlaps a first end portion of the second area, wherein the source electrode is electrically connected to a data line; and
   a drain electrode spaced apart from the source electrode, wherein the drain electrode overlaps a second end portion of the second area.

5. The thin film transistor substrate of claim 4, further comprising:
   a pixel electrode electrically connected to the drain electrode through a contact hole defined in the passivation layer.

6. The thin film transistor substrate of claim 1, wherein the passivation layer comprises silicon nitride.

7. The thin film transistor substrate of claim 1, wherein an area ratio of the first area with respect to the second area is in a range of about 2 to about 8.

8. The thin film transistor substrate of claim 1, wherein a width of the oxide semiconductor pattern is in a range of about 10 micrometers to about 100 micrometers.

* * * * *